United States Patent [19]

Taruno et al.

[11] Patent Number: 5,698,152
[45] Date of Patent: Dec. 16, 1997

[54] RESIN TABLET FOR SEALING SEMICONDUCTOR

[75] Inventors: Tomohiro Taruno; Yoshio Toyoda; Hirofumi Ohno; Shoichi Kimura; Hiroyuki Asao; Shinichi Kanai, all of Osaka, Japan

[73] Assignee: Nitto Denko Corporation, Osaka, Japan

[21] Appl. No.: 736,782

[22] Filed: Oct. 25, 1996

Related U.S. Application Data

[63] Continuation of Ser. No. 612,499, Mar. 7, 1996, abandoned, which is a continuation of Ser. No. 458,681, Jun. 2, 1995, abandoned, which is a continuation of Ser. No. 373,898, Jan. 17, 1995, abandoned, which is a continuation of Ser. No. 209,052, Mar. 11, 1994, abandoned.

[30] Foreign Application Priority Data

Feb. 23, 1994 [JP] Japan .................................. 6-051307

[51] Int. Cl.⁶ .................................................. H01L 21/56
[52] U.S. Cl. .............. 264/272; 264/272.13; 264/328.17; 264/328.5; 264/331.12; 437/212; 525/481; 525/523; 528/87; 528/501; 528/502; 428/543
[58] Field of Search ....................... 525/481, 523; 528/87, 501, 502; 428/543; 264/272.13, 272.17, 328.17, 328.5, 331.12; 437/212

[56] References Cited

U.S. PATENT DOCUMENTS 4,293,519  10/1981  Knappenberger .................. 264/272.13
4,554,126  11/1985  Sera ....................................... 264/272

FOREIGN PATENT DOCUMENTS 0530377  3/1993  European Pat. Off. ........ H01L 21/56
9216969  10/1992  WIPO .

OTHER PUBLICATIONS

Patent Abstracts of Japan, vol. 018 No. 372 (E-1577), 13 Jul. 1994 & JP-A-06 104301 (Nitto Denko Corp) 15 Apr. 1994.

Chemical Abstracts 118:213804, "Epoxy Adhesives in Microelectronic Hybrid Applications", Benson et al.

Chemical Abstracts 105:7206, "Removal of Volatile Substances from Epoxy Resins and Curing Agents", Bondarenko et al.

Primary Examiner—Frederick Krass
Attorney, Agent, or Firm—Sughrue, Mion, Zinn, Macpeak & Seas, PLLC

[57] ABSTRACT

A resin tablet for sealing a semiconductor formed by solidifying a molten thermosetting resin composition by cooling, wherein the content of volatile matters in the tablet is 0.05% by weight or less, and the content of gelled particles in the tablet is 0 for the particles of 60 mesh on and is 10 ppm or less for the particles of 100 mesh on.

22 Claims, 2 Drawing Sheets

RESIN TABLET FOR SEALING SEMICONDUCTOR

This is a Continuation of application Ser. No. 08/612,499 filed on Mar. 7, 1996, now abandoned, which is a Continuation of application Ser. No. 08/458,681 filed Jun. 2, 1995, now abandoned, which is a Continuation of application Ser. No. 08/373,898 filed Jan. 17, 1995, now abandoned, which is a Continuation of application Ser. No. 08/209,052 filed Mar. 11, 1994, (abandoned).

FIELD OF THE INVENTION

The present invention relates to a resin tablet for sealing a semiconductor chip.

BACKGROUND OF THE INVENTION

For resin sealing (package) of a semiconductor chip using a resin composition, a transfer molding method is usually used. In the transfer molding method, the semiconductor chip is set in a mold cavity of a transfer molding machine, a tablet comprising a thermosetting resin composition is placed in a chamber of the transfer molding machine, the tablet is plasticized by heating and at the same time pressed by plungers, the plasticized resin is introduced into the mold cavity through a spool, a runner, a gate, etc., and forming and setting are completed. Further, a method for sealing a semiconductor chip with a small tablet, which is called a multiplunger system and belongs to the category of the transfer molding method, has recently been proposed.

Hitherto, as the tablets, those produced by a cold compression molding method (i.e., a method wherein a raw material is plasticized and kneaded by a hot roll or a heat extruding machine, after cooling the kneaded material is powdered by a grinder, a prescribed amount of the powder is supplied into a mold, and the powder in the mold is compressed and molded into tablets by an upper plunger and a lower plunger at room temperature) are used. However, since the tablet produced by the above-described method contains many voids and has a high moisture content (the water adsorbing area is large due to the large voids), when a semiconductor chip is sealed with the tablet, air in the voids and moisture evaporated at the transfer molding temperature (150° C. to 180° C.) are degassed insufficiently, whereby voids are liable to form in the sealing resin, and the voids weaken the strength of the semiconductor device itself, reduce the reliability of the device, and cause poor products, which inevitably result in lowering the yield of the semiconductor devices.

The inventors already proposed a method for producing tablets wherein a resin supplying passage member is connected to the forward end of a screw-containing cylinder of a kneading extruder, a kneaded molten resin having compounded therewith a curing agent in the cylinder is injected in a tablet-molding mold through the resin supplying passage member at an extruding pressure, and is molded under pressing (hereinafter, the method is referred to as a "plasticization pressuring method") as described in U.S. patent application Ser. No. 07/978,439 filed Nov. 18, 1992 and now abandoned (corresponding to WO 92/16969, published on Oct. 1, 1992).

It is well known that the removal of the voids in the tablet and the reduction of the moisture content of the tablet are effective for removing the voids formed at sealing a semiconductor chip with a tablet.

Since in the resin tablet obtained by the plasticization pressurizing method described above, the compressibility [a ratio of an apparent specific gravity of a tablet to a specific gravity (a true specific gravity) of the tablet when voids in the tablet are decreased to 0] of the tablet can be increased to at least 98%, i.e., the voids in the tablet can be substantially reduced to 0 and also the moisture content of the tablet can be decreased below 0.02% by weight, by the plasticization pressurizing method described above, the amount of the voids formed at sealing a semiconductor chip described above can be decreased as compared to the case of using the conventional tablets.

Now, in a recent highly integrated semiconductor device, each of the semiconductor chips is expensive and hence the more improvements of the yield and the reliability by the decrease of voids in the tablets have been required.

However, according to the inventors' experimental result, it was found that there was a limit in the decrease of the voids in the sealed molding article using the tablet obtained by the plasticization pressurizing method. In fact, when QFP-80 pins were sealed by a transfer molding machine of 16 sets of chambers each coupled with 2 cavities, total cavity number being 32, using the tablets each having a content of water as a volatile matter, i.e., a moisture content of 0.02%, the compressibility of 98%, the outer diameter of 13 mm and the height of 20 mm, the number (average value) of the voids (diameter of at least 0.1 mm) per one cavity reached 3.

Thus, as a result of investigating the reason thereof, the inventors have found that a slight amount of volatile components comprising organic low molecular weight compounds (e.g., ketone series, alcohol series, and aromatic hydrocarbon series compounds) other than water remaining in the raw materials of a resin composition constituting the tablets and a slight amount of volatile components comprising organic low molecular weight compounds formed by the reaction of the raw materials with each other at the production of the tablets are confined in the tablets and they are vaporized at the transfer molding temperature in the case of sealing a semiconductor chip, thereby forming voids.

According to the inventors' experiment, "the reaction of the raw materials with each other" described above means formation of aromatic hydrocarbons, etc., by the reaction of a curing accelerator and a curing agent, formation of lower alcohols by the reaction of a filler and a surface treating agent for the filler, etc.

Further, in the plasticization pressurizing method described above, a resin supplying passage member is equipped to the forward end of the cylinder of an extruding machine and when the outlet of the resin supplying passage member coincides with the resin injection inlet of a tablet molding mold, the injection of a resin into the mold is conducted. Accordingly, since it becomes necessary to spontaneously stop a stream of the resin in the resin supplying passage member until the injection of the next resin, the stream of the resin in the resin supplying passage member becomes intermittent. Thus, while the stream of the resin is stopped, gelation of the molten resin composition (compounded with a curing agent) is accelerated to accelerate growth of gelled particles and if the gelled particles are larger than the thickness of the gate at transfer molding described above, gate clogging occurs.

SUMMARY OF THE INVENTION

Accordingly, an object of the present invention is to provide a semiconductor sealing resin tablet capable of restraining formation of gelled particles of the tablet produced by the plasticization pressurizing method described above, capable of smoothly sealing a semiconductor chip by a transfer molding method without accompanied by gate clogging, and capable of sealing a semiconductor chip by transfer molding without forming voids and with a high quality.

The semiconductor sealing resin tablet according to the present invention is formed by solidifying a molten thermosetting resin composition by cooling, wherein the content of volatile matters is 0.05% by weight or less and the content of gelled particles in the tablet is 0 for 60 mesh on and 10 ppm or less for 100 mesh on.

In addition, the "volatile matters" or "volatile components" in the present invention, unless otherwise indicated, mean to contain water together with organic low molecular weight compounds. Further, the content of the volatile matters comprising organic low molecular weight compounds in the volatile matters is preferably 0.03% by weight or less.

DETAILED DESCRIPTION OF THE INVENTION

Figure 1:
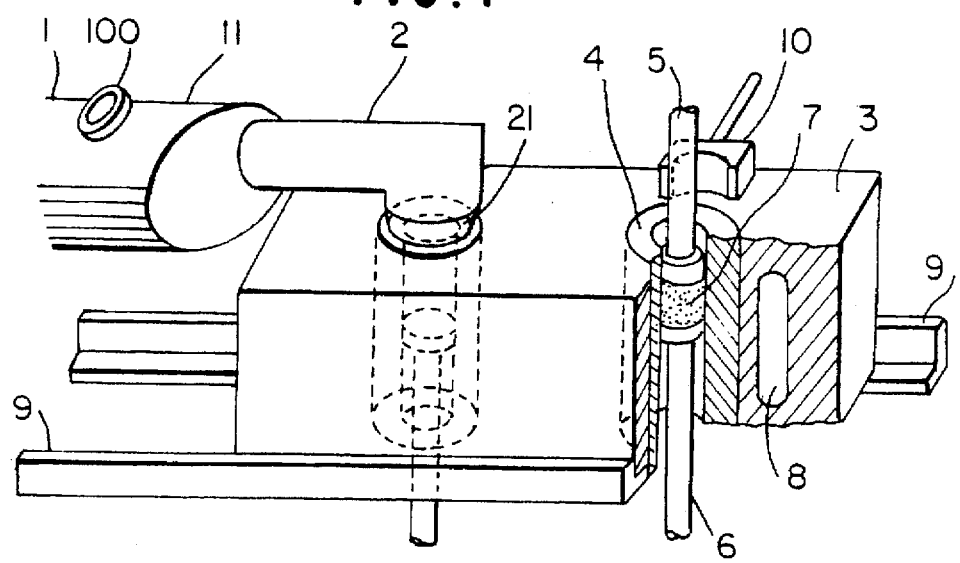
FIG. 1 is a slant view showing an example of the production apparatus used for the production method of the semiconductor sealing resin tablets of the present invention, FIG. 2 (a) is a cross sectional view showing the stirrer in the apparatus shown in FIG. 1, FIG. 2 (b) is the cross sectional view cut along the line A—A in FIG. 2 (a), FIG. 2 (c) is a cross sectional view showing other example of the stirrer.

The present invention is described in detail below.

In general, the thermosetting resin composition used in the present invention comprises a thermosetting resin such as an epoxy resin as the main component, and contains at least a curing agent, a curing accelerator, a filler, and a surface treating agent such as a silane coupling agent.

For determining the content of the volatile matters in the present invention, a method of dissolving 5 g of the resin tablets in 5 ml of dehydrated acetone and measuring the supernatant liquid by gas chromatography can be used.

In the present invention, the volatile matters are water and organic low molecular weight compounds (organic solvents). The content of water in the volatile matters is preferably 0.02% by weight or less and the content of the organic low molecular weight compounds in the volatile matters is preferably 0.03% by weight or less.

The content of the gelled particles in the resin tablet of the present invention can be measured by the following method.

100 g of the resin tablets are dissolved in 300 ml of acetone with stirring, the solution is filtered by two stage screens of 60 mesh and 100 mesh, and the amount of the gelled particles (acetone insoluble matters) of 60 mesh on (remained on the screen of 60 mesh) and the amount of the gelled particles (acetone insoluble matters) of 100 mesh on (remained on the screen of 100 mesh) are measured (the two stage screens can be by, for example, ASTM E-58T). Since an inorganic filler is frequently contained in these acetone insoluble matters, the gelled particles thus collected are heated in a crucible at 400° C. for 2 hours to burn up organic components (i.e., the true gelled particle content), the amount of the inorganic filler is measured, and the content of the gelled particles is obtained by the following formulae.

Gelled particle content (X)=(Acetone insoluble matters) —(Amount of the inorganic filler)

Gelled particle content (ppm)=[gelled particle content (X) g/100 g]×10$^6$

In the resin tablet of the present invention, the content of the volatile matters and the contents of the gelled particles are specified as described above, and also it is preferred that a deviation of a distribution of the compressibility is less than ±1%, the compressibility is at least 98%, the content of metallic impurities is less than 50 ppm, preferably less than 20 ppm, and more preferably 10 ppm, and the Shore hardness (measured at 23° C.) is at least 65.

The compressibility (C) can be obtained by the following equation;

$$C=[(W/\rho)/V]\times 100\%$$

wherein $\rho$ (g/cm$^3$) is a specific gravity of a cured resin tablet, V (cm$^3$) is a volume of the resin tablet, and W (g) is a weight of the resin tablet. The cured resin tablet of this case can be obtained by completely curing (e.g., the conditions of 175° C. and 10 minutes) the resin tablet by a transfer molding machine under pressure of 200 kg/cm$^2$.

When the resin tablet is a columnar form, the deviation (Ri) of the distribution of the compressibility is obtained as follows.

Figure 5:
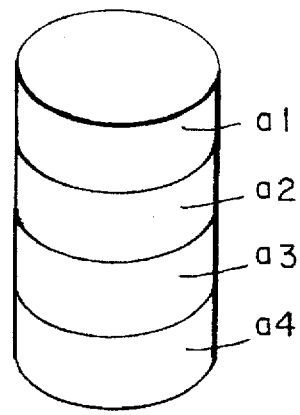
FIG. 5 is a view showing the calculation state of the compressibility of the semiconductor sealing resin tablet of the present invention.

The columnar tablet is split into $a_1$, $a_2$, $a_3$, and $a_4$ in the lengthwise direction as shown in FIG. 5 (the split number is usually 4), the compressibility Ci of each split tablet piece is obtained by the manner described above, the average value $C_o$ of the compressibilities Ci is obtained, and the deviation (Ri) is calculated by the following equation:

$$Ri=(Ci-C_o)/C_o\times 100\%$$

When the tablet is other than a columnar form, the tablet is properly split into 4 portions each having an equal volume and then Ci and $C_o$ can be obtained by the manners described above.

The metallic impurities are substantially metals, and metal compounds such as metal oxides, etc., are not included in the "metallic impurities". The metallic impurities are measured by a magnetic analyzer (e.g., TMA-01, trade name, made by Tatsumori Kogyo K.K.).

The amount of fine powders attached to the tablet can be measured by scattering the fine powder on the surface of the tablet by an air gun of an air pressure of from 2 to 5 kg/cm$^2$.

The form and the size of the resin tablet of the present invention is that, when the tablet is a columnar form, it is preferred that the outer diameter (D) is 20 mm or less, and the ratio L/D of the length (L) to the outer diameter (D) is 1 or more (usually up to 10), or the outer diameter (D) is at least 20 mm and the ratio L/D of the length (L) to the outer diameter (D) is usually 1 or less (usually lower limit: 0.2).

The Shore hardness of the resin tablet can be measured by a Shore D hardness tester (at a measurement temperature of 23° C.).

The thermosetting resin composition used in the present invention generally comprises a thermosetting resin as the main component, a curing agent, a curing accelerator, a filler, and a surface treating agent (an agent of treating the surface of the filler for increasing the bonding strength between the filler and the thermosetting resin), but the thermosetting resin composition of the present invention may further contain, if necessary, other additives such as a mold-releasing agent, a pigment, a flame retardant, a flame retardant assistant, etc.

The proportions of the constituting components in the thermosetting resin composition of the present invention are, for example, 100 parts by weight of a thermosetting resin as the main component, from 10 to 30 parts by weight of a flame retardant assistant, from 40 to 80 parts by weight of a curing agent, from 200 to 1,900 parts by weight of a filler, from 10 to 20 parts by weight of a flame retardant, from 1 to 3 parts by weight of a mold-releasing agent, from 1 to 3 parts by weight of a pigment, from 1 to 3 parts by weight of a curing accelerator, and from 1 to 3 parts by weight of a surface treating agent.

Examples of the thermosetting resin as the main component which can be used are an epoxy resin, a silicone resin, a polyimide resin, etc. Of those, the epoxy resin is particularly preferred.

When the thermosetting resin as the main component is an epoxy resin, in particular, novolac type epoxy resin, a novolac type resin such as cresol novolac, phenol novoloc, etc., are preferably used as the curing agent, and triphenyl phosphine, DBU [1,8-diazabicyclo-(5,4,0)-undecene-7], an imidazole series compound, etc., are preferably used as the curing accelerator. The volatile components formed by the reaction of the curing agent and the curing accelerator are benzene, etc. Further, a silica powder is preferably used as the filler, and β-(3,4-epoxycyclohexyl) ethyltrimethoxysilane, γ-glycidoxypropyltrimethoxysilane, N-β-(aminoethyl)-γ-aminopropylmethyldimethyldimethoxysilane, etc., are preferably used as a surface treating agent for the filler. The volatile matters formed by the reaction of the filler and the surface treating agent are methanol, etc.

In producing the resin tablet of the present invention, the epoxy resin, the curing agent, the curing accelerator, the filler, the surface treating agent, etc., which are the constituting components of the resin composition for producing the resin tablet are previously heated (e.g., to about 150° C. for about 30 minutes) under reduced pressure separately or as a mixture thereof, whereby the volatile components contained in these components and formed by the reaction of the components are removed.

The semiconductor sealing resin tablet of the present invention can be obtained by, after previously removing at least the volatile components formed by the reactions of the raw materials each other, which are the constituting components of the thermosetting resin composition for producing the semiconductor sealing resin tablet of the present invention and preferably simultaneously removing the volatile components contained in the raw materials, compounding the thus treated components with other components to obtain a thermosetting resin composition, kneading and melting the composition in a kneading extruder in which the forward end of the screw-containing cylinder is connected to a stirrer-containing resin supplying passage member, and injecting the kneaded and melted resin into a tablet molding mold through the resin supplying passage member containing a stirrer while stirring the resin composition with the stirrer, and pressing the resin composition at an extruding pressure.

In general, a curing agent and a curing accelerator are mixed, the volatile components formed are removed, a filler and a surface treating agent thereof are mixed, the volatile components formed are removed, and the mixtures thereof are then compounded with other components to obtain a thermosetting resin composition. The resin composition is kneaded and melted in a kneading extruder wherein the forward end of the screw-containing cylinder thereof is connected to a stirrer-containing resin supplying passage member, and the resin composition is injected in a tablet molding mold through the kneaded molten resin supplying passage member while stirring the resin composition therein, and molded under extruding pressure.

An example of the production method of the semiconductor sealing resin tablet of the present invention is explained below.

FIG. 1 shows examples of a kneading extruder and a tablet molding mold used for the production of the semiconductor sealing resin tablets of the present invention.

In FIG. 1, a kneading extruder 1 has a cylinder 11 containing therein a screw and it is preferred to form a degassing outlet 100 to the cylinder for reducing the pressure in the inside of the cylinder 11. A mold holder 3 is reciprocated along track rails 9,9 and is equipped with a cooling jacket 8. A tablet molding mold 4 holded by the mold holder 3 can be closed by an upper plunger 5 and a lower plunger 6. A resin supplying passage member 2 is connected to the forward end of the cylinder 11 of the kneading extruder 1, contains therein a stirrer, and the surface of a resin injection outlet 21 of the resin supplying passage member 2 can be slidably brought into contact with the upper surface of the tablet molding mold 4. A numeral 10 shows a tablet delivery means.

Figure 2A:
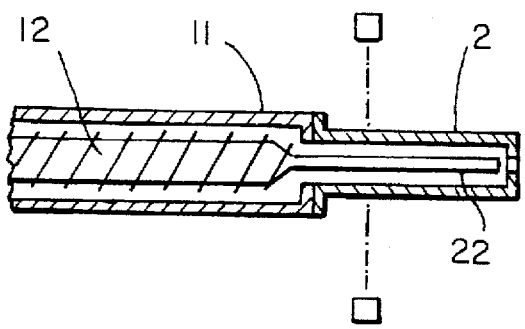
Figure 2B:
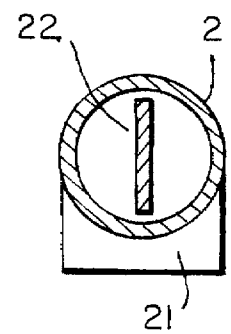
Figure 2C:
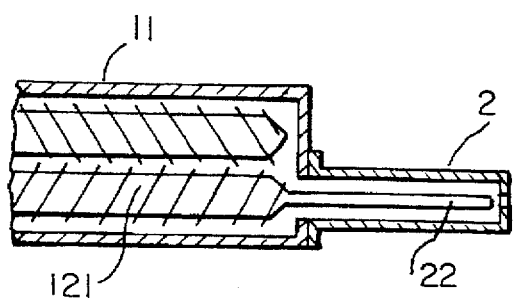

As the stirrer-containing resin supplying passage member 2 described above, a resin supplying pipe 2 equipped to the forward end of the cylinder 11 and containing therein a stirrer 22 fixed to the forward end of a screw 12 in the cylinder 11 as shown in FIG. 2 (a) and FIG. 2 (b) [i.e., the cross sectional view taken along the line A—A in FIG. 2 (a)] can be used. In addition, the clearance between the inside wall of the resin supplying pipe 2 and the stirrer 22 is generally 1 mm or less, and preferably 0.5 mm±0.1 mm.

When a twin-screw kneading extruder 1 is used, the kneading extruder 1 equipped with a resin supplying pipe 2 at the forward end of the cylinder 11 such that the resin supplying pipe 2 is in a same line as one screw 121 of them and having a stirrer 22 fixed to the forward end of the screw 121 can be used as shown in FIG. 2 (c).

A method for producing the semiconductor resin tablets of the present invention comprising an epoxy resin composition using the apparatus as shown in FIG. 1 is explained below.

Figure 3:
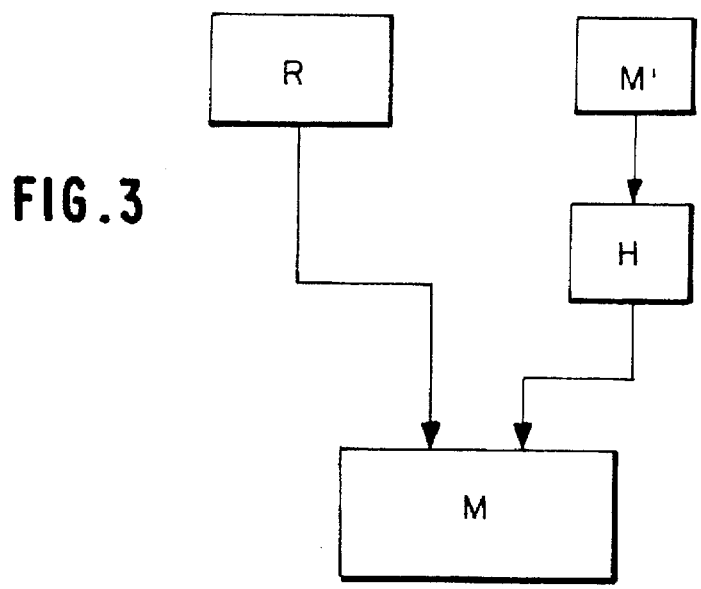
FIG. 3 is a schematic view showing a preparation scheme of a resin composition used for the production method of the semiconductor sealing resin tablets of the present invention.

For producing the resin tablets of the present invention using the apparatus, as shown in FIG. 3, a filler and a surface treating agent are pre-mixed with a Henschel mixer M', and the mixture obtained is dried by heating (e.g., at 120° C., 3 hours) by a heat-dryer H to previously remove the volatile matters (organic low molecular weight compounds, etc.) formed by the reaction of the filler and the surface treating agent. Apart from this, a curing agent and a curing accelerator are mixed under heating (e.g., 150° C., 30 minutes) by a vacuum mixing kiln R to previously remove the volatile matters (organic low molecular weight compounds, etc.). The above two mixtures from which the volatile components were removed are uniformly mixed (dry blend) by a Henschel mixer M together with other necessary components such as an epoxy resin, a mold-releasing agent, a pigment, a flame retardant, a flame retardant assistant, etc., to obtain an epoxy resin composition.

The epoxy resin composition is supplied to the kneading extruder 1 shown in FIG. 1, the epoxy resin composition supplied in a hopper of the kneading extruder 1 is sent to the inside of the heating cylinder 11 of the kneading extruder 1 by the rotation of the screw in the kneading extruder 1 and melt-kneaded under heating to usually a temperature of from about 60° to 150° C. while, preferably, evacuating the inside of the cylinder from the degassing outlet 100. The molten resin composition is filled in the tablet molding mold 4 through the resin supplying passage member 2 by the extruding force of the screw. In this case, by equipping a pressure detector such as a load cell, etc., to the lower plunger 6, the injection pressure of the molten resin is detected and when filling of the molten resin is completed, a signal of completing filling of the resin is generated.

When the signal of completing filling of the resin is received, a mold holder 3 is transferred along the track rails 9 and when the tablet molding mold 4 reaches to position of the injection outlet 21 of the resin supplying passage member 2, the mold holder 3 is stopped. The resin filled in the tablet molding mold thus transferred is molded while being pressed by the upper plunger 5 and the lower plunger 6 at a pressure of from about 50 to 300 kg/cm$^2$. In this case, cooling water adjusted to a temperature of from 5° C. to 50° C. is circulated through a cooling jacket 8 of the mold holder 3.

The cooled resin (from about room temperature to 60° C.) is pushed up by the lower plunger 6 and the resin molding, i.e., a tablet 7 thus pushed up, is ejected by the tablet ejecting means 10.

When filling of the molten resin in another tablet molding mold is completed, the mold holder is transferred, and the procedure described above is repeated.

In the above procedure, when filling of the resin in the tablet molding mold of the left side (or right side) is completed and until the initiation of filling the resin in the tablet molding mold of the right side (or left side), the injection of the resin composition is spontaneously stopped by the slidable contact of the injection outlet 21 of the resin supplying passage member 2 with the mold holder 3 (usually for shorter than 1 second) but, it is considered that since the screw is rotated and the stirrer continues the rotation thereof, the resin composition in the resin supplying passage member 2 can be stirred and fluidized well, whereby the formation of the gelled particles can be prevented well and the gelled particles having a particle size of 60 mesh on can be decreased to 0.

In the above-described production system, the supplying temperature of the resin composition into the molding mold is generally from about 80° C. to 120° C. and the temperature of the molding mold is from about room temperature to 50° C. Usually, a cooling water (usually warm water) is circulated through the mold to cool the resin tablet formed in the mold from the surface to the inside thereof and in the resin tablet thus cooled, the gelling time at transfer molding generally becomes shorter a little from the surface to the inside thereof. The surface temperature of the tablet taken out from the mold is usually 50° C. or lower.

The pressure at the production of the tablet is generally from 50 kg/cm$^2$ to 300 kg/cm$^2$, and preferably from 80 kg/cm$^2$ to 120 kg/cm$^2$.

Figure 4:
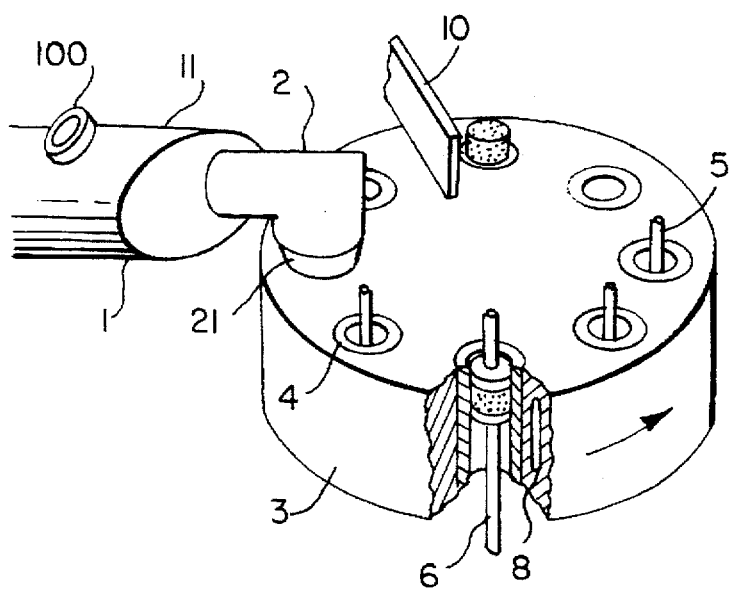
FIG. 4 is a slant view showing other example of the production apparatus used for the production method of the semiconductor sealing resin tablets of the present invention.

FIG. 4 shows another examples of a kneading extruder and a tablet molding mold used for the production of the semiconductor sealing resin tablets of the present invention.

In FIG. 4, a kneading extruder 1 has a stirrer-containing resin supplying passage member 2 connected to the forward end of the cylinder thereof and has the same structure as the kneading extruder shown in FIG. 1. In this case, it is also preferred to form a degassing outlet 100 to the cylinder of the extruder. A turn table 3 has disposed therein plural tablet molding molds 4, 4, . . . on a same circumference with a definite interval. Each tablet molding mold 4 contains an upper plunger 5 and a lower plunger, and a cooling jacket 8 is formed around each molding mold 4. A scraper 10 for delivering each resin tablet produced is equipped onto the upper surface of the turn table.

For producing the semiconductor sealing resin tablets comprising an epoxy resin composition of the present invention using the apparatus shown in FIG. 4, in general, after pre-mixing a curing agent and a curing accelerator and pre-mixing a filler and a surface treating agent followed by removing the volatile components formed and mixing both the mixtures with other necessary components by the same manners as described above to obtain an epoxy resin composition, the epoxy resin composition is supplied to the kneading extruder 1, kneading in the kneading extruder 1 while, preferably, evacuating the inside of the cylinder from the degassing outlet 100, and the molten resin composition (having a temperature of from 80° C. to 120° C.) is supplied into one tablet molding mold 4 (kept at about 40° C.) through the resin supplying passage member 2 by the screw extruding force of the kneading extruder 1 while stirring the resin composition with the stirrer in the resin supplying passage member 2. When filling of the molten resin composition in the tablet molding mold is completed, a signal of completing filling of the resin is generated by a pressure detector such as a load cell, etc., as in the above-described case of using the apparatus shown in FIG. 1 to rotate the turn table 3 to the direction shown by the arrow and when the next tablet molding mold 4 reaches the injection outlet 21 of the resin supplying passage member 2, the turn table 3 is stopped and the supply of the molten resin composition into the tablet molding mold 4 is initiated.

In addition, when the resin is cut by sliding by the rotation of the turn table 3, the resin is cut by sliding while being pressed by a back pressure (extruding pressure), whereby the weight accuracy of the tablet is further improved.

On the other hand, directly after parting the tablet molding mold 4 completing filling of the molten resin composition from the injection outlet 21 of the resin supplying passage member 2, an upper plunger is introduced into the tablet molding mold 4, the upper plunger 5 and the lower plunger 6 are transferred together with the turn table 3, the resin composition in the tablet molding mold 4 is pressed by the upper plunger 5 and the lower plunger 6 at a pressure of from about 50 to 300 kg/cm$^2$ while cooling (by circulating cooling water adjusted to a temperature of from 5° C. to 50° C. through the cooling jacket 8 of the turn table 3), the semiconductor sealing resin tablet solidified by cooling in the mold is released from the mold by pushing up of the lower plunger before the scraper 10, and the tablet is transferred from the turn table by the action of the scraper 10.

The number of a pair of the upper plunger and the lower plunger described above is plural and by the turn table system of operating each upper and lower plungers to each tablet molding mold 4 successively filled with the molten resin composition as described above, semiconductor sealing resin tablets are continuously produced.

In the case of using the apparatus shown by FIG. 1 or FIG. 4, for increasing the production speed of the resin tablets, it is effective to increase the moving speed of the mold holder or the turn table, or to increase the disposed number of the tablet molding molds 4 on the turn table 3 and at the same time increase the supplying speed of the resin composition into the tablet supplying mold 4.

The resin tablet of the present invention is used in the case of sealing a semiconductor chip by transfer molding. That is, a semiconductor chip is set in the mold cavity of a transfer molding machine, the resin tablet of the present invention is placed in the chamber of the transfer molding machine, the tablet is plasticized by heating and pressed by a plunger, the plasticized resin is introduced into the mold cavity through a spool, a runner, a gate, etc., and forming and curing of the resin are conducted to obtain a sealed semiconductor device. In this case, after pre-heating the tablet by high-frequency induction heating, the tablet can be placed in the chamber of the transfer molding machine. Further, the sealed semiconductor device described above is generally post-cured at a temperature of 165° C. to 185° C. for from 5 to 10 hours.

When the resin tablet comprising the thermosetting resin composition prepared by compounding a thermosetting resin as the main component with a curing agent, a curing accelerator, a filler and a surface treating agent is produced, volatile components comprising organic low molecular weight compounds are formed by the reactions of the raw materials each other, for example, by the reaction of the filler and the surface treating agent and the reaction of the curing agent and the curing accelerator, and the volatile components become the serious cause of forming the voids in the resin sealed article. However, in the resin tablet of the present invention, the content of the volatile components is restrained below 0.05% by weight (containing water), whereby the contents vaporized at the transfer molding temperature can be substantially decreased to a slight amount.

Further, since the compressibility of the tablet is at least 98%, the amount of air carried can be decreased to a slight amount and in particular, since the deviation of the distribution of the compressibility in the lengthwise direction of the tablet is lower than ±1%, the slight amount of air is uniformly distributed, whereby the amount of air carried can be substantially decreased to 0.

Thus, the formation of voids in the sealing step of a semiconductor chip can be prevented well.

Furthermore, in the semiconductor sealing resin tablet of the present invention, since the content of the gelled particles is 0 for 60 mesh on and is 10 ppm or less for 100 mesh on, clogging of a gate can be prevented even when the gate is shallow, and transfer molding can be smoothly conducted.

Furthermore, in the resin tablet of the present invention, by decreasing the content of metallic impurities below 50 ppm, the generation of the spark of a high frequency induction heating apparatus can be prevented at high frequency induction heating of the resin tablet and also, since the compressibility of the resin tablet is at least 98%, the dielectric constant of the whole tablet is stabilized and the amount of heat generated at high frequency induction heating of the resin tablet becomes uniform, whereby transfer molding is stabilized.

By decreasing the attaching amount of a fine powder finer than 250 mesh to the resin tablet of the present invention less than 0.002% by weight, the tablet can correspond well to cleaning of a semiconductor sealing factory.

By increasing the Shore hardness of the tablets to at least 65, the loss of the tablets during transportation can be surely prevented.

In the production method of the semiconductor sealing resin tablets of the present invention, after previously removing the volatile components formed at heat kneading the raw materials each other (for example, the volatile components formed at the contact stage of a curing agent and a curing accelerator and the contact stage of a filler and a surface treating agent), the whole resin composition is supplied to the kneading step, whereby the content of the volatile matters can be greatly reduced as described above.

In the production method of the semiconductor sealing resin tablets of the present invention, when the outlet of the resin supplying passage member coincides with the injection inlet for the resin composition of a tablet molding mold, the resin composition is supplied to the mold and the supply of the resin is spontaneously stopped until the next resin composition is supplied and since at stopping the supply of the resin composition, the resin composition in the resin supplying passage member is stirred well, the progress of gelation of the resin composition can be restrained well and also the formation of gelled particles can be restrained well.

In the production method of the resin tablets of the present invention, since the resin composition is injected into the tablet molding mold in a softened state and pressurized therein, the resin composition can be pressurized well even in the inside thereof and the pressurized force can be relatively lowered. Also, the resin composition in the mold is pressurized while cooling the mold and hence since in spite of the action of the surface pressure between the inside surface of the mold and the resin composition during molding, the adhesive force between the inside surface of the mold and the resin composition is decreased by cooling and the shrinkage of the resin having a large expansion coefficient by cooling is larger than the shrinkage of the mold by cooling, the tablet molded can be smoothly taken out of the mold by a relatively low releasing force.

Since in the above production step, a grinding step is not required different from a conventional cold compression molding method, the formation of a metal powder can be prevented well and the content of metallic impurities can be easily decreased below 50 ppm.

In the production method of the resin tablets of the present invention, the formation of taper for releasing the molded tablet from the mold can be substantially unnecessary (lower than 1/200) and as a result thereof, the chamber of the transfer molding machine can be designed with a high accuracy, whereby the clearance between the tablet molded and the inside surface of the pot can be greatly reduced and from this point, the voids in the tablet can be effectively removed.

Further, in the production method of the resin tablets of the present invention, since cooling of the tablet in the mold proceeds from the outer surface to the inside thereof, the inside of the tablet is exposed to a high temperature for a longer time to generally give the property of slightly short gelling time. On the other hand, at transfer mold molding of a semiconductor chip using the resin tablet of the present invention, there is a tendency that the outside of the tablet is more quickly fluidized than the central portion, the outside more quickly flows in the cavity and the central portion flows in the cavity delayed in time. Accordingly, when the gelling time of the central portion of the tablet is slightly short, reaction of a cull portion after transfer mold molding proceeds well, which is advantageous for the prevention of the inconvenience on molding of so-called "cull remaining".

The present invention is described in more detail by reference to the following Examples and Comparative Examples, but it should be understood that the present invention is not construed as being limited thereto. All parts, percents, ratios and the like are by weight unless otherwith indicated.

EXAMPLE 1

The components of a resin composition used were as follows.

|  | Parts |
|---|---|
| Cresol Novolac Type Epoxy Resin (epoxy equivalent 195) | 100 |
| Cresol Novolac (hydroxy group equivalent 107) (curing agent) | 80 |
| Triphenylphosphine (curing accelerator) | 2 |
| Fused Silica Powder (filler) | 500 |
| γ-Glycidoxypropyltrimethoxysilane (surface treating agent) | 2 |
| Brominated Epoxy Resin (epoxy equivalent 275) (flame retardant) | 10 |
| Carnauba Wax (mold-releasing agent) | 2 |
| Carbon Black (pigment) | 2 |

The production apparatus shown in FIG. 1 was used. The construction of the stirrer in the production apparatus was that of the stirrer shown in FIG. 2 (a) and the size of the tablet molding mold was 13 mm in the inside diameter and 20 mm in height.

In the components described above, the filler and the surface treating agent were mixed by a Henschel mixer for 30 minutes and the volatile components (methanol, etc.) formed by the reaction of the components were removed by heat-treating at 150° C. for 2 hours. Apart from this, the curing agent and the curing accelerator were placed in a vacuum mixing kiln and volatile components [aromatic hydrocarbons (benzene, etc.), etc.] formed by the reaction of the components were previously removed under the conditions of 150° C., 30 minutes, and 500 torr.

The surface treating agent-added filler and the reaction product of the curing agent and the curing accelerator were blended with other components (the epoxy resin, etc.) by a Henschel mixer for 30 minutes to obtain an epoxy resin composition and the blended epoxy resin composition was supplied to the kneading extruder (the extruder 1 in FIG. 1) having an inside diameter of the cylinder of 50 mm and of an injecting amount (average value) of 10 kg/hour. The kneading temperature was about 110° C. The molding pressure in the tablet molding mold was 100 kg/cm² and the temperature of cooling water circulating the cooling jacket of the mold holder was 20° C. In addition, an evacuation treatment from the degassing outlet 100 of the kneading extruder was not applied.

The resin tablet obtained was a columnar form having a diameter of 14 mm and a height of 17 mm.

When the content of the volatile matters in the tablet was measured by gas chromatography, the content was 0.04% and the components were as follows. That is, the water content was 0.02%, the content of methanol was 0.01%, and the content of benzene was 0.01%.

In addition, the contents of the volatile matters of the tablet were measured by gas chromatography as described above and the details thereof were as follows.

5 g of the tablet was placed in a screw pipe with a cap and after adding thereto 5 ml of dehydrated acetone, the mixture was shaken at room temperature for 1 hour. Acetone insoluble matters was subjected to a centrifugal separation (1,000 r.p.m., 10 minutes), and 2 μl (measured by a micro syringe) of the supernatant liquid was injected in the injection of a gas chromatograph (HP5890A, trade name, made by YokokawaHewlett-Packard, Ltd.).

Analytical Condition:

| Column: | Tenax GC (length 1 m, inside diameter 2.0 mm, size of filler particles 80 to 100 mesh) |
|---|---|
| Column Temperature: | 50 to 270° C. (10° C. increasing per minute) |
| Column Head Pressure: | 80 Kpa |
| Carrier Gas: | Helium |
| Carrier Gas Flow Rate: | 30 ml/minute |
| Injection Temperature: | 250° C. |
| Detector Temperature: | 250° C. |

From the area of the chart obtained by the analytical conditions, the contents of the volatile matters were calculated.

Further, the compressibility of the tablet was at least 98% and in addition, when the deviation of the distribution of the compressibility of the tablet in the lengthwise direction was measured (the split number of the tablet was 4), the deviation was ±1% or less.

Furthermore, the content of the gelled particles in the tablet of 60 mesh on was 0 and the content of the gelled particles of 100 mesh on was 2 ppm or less. The content of metallic impurities was less than 10 ppm and the amount of attached fine powders having sizes of 250 mesh or finer was less than 0.02%. Also, the Shore hardness (measured at 23° C.) was 70.

Using the tablet thus produced, a semiconductor chip having 80 pins and having a size of 14 mm×20 mm×2.7 mm was sealed by a transfer molding apparatus (16 sets of chambers each coupled with 2 cavities, total cavity number 32) and when the sealed molding was perspectively observed by soft X rays, the average void number (void size of at least 0.1 mm in diameter) per one cavity was 0.1 only.

EXAMPLE 2

The components of the resin composition used were as follows.

|  | Parts |
|---|---|
| Cresol Novolac Type Epoxy Resin (epoxy equivalent 195) | 100 |
| Phenol Novolac (hydroxy group equivalent 107) (curing agent) | 55 |
| Triphenylphosphine (curing accelerator) | 3 |
| Silica Powder (filler) | 652 |
| γ-Glycidoxypropyltrimethoxysilane (surface treating agent) | 1 |
| Brominated Epoxy Resin (epoxy equivalent 275) (flame retardant) | 12 |
| Carnabau Wax (mold-releasing agent) | 5 |
| Carbon Black (pigment) | 0.5 |

In the components described above, the curing agent and the curing accelerator, and the filler and the surface treating agent were pre-treated in the same manners as in Example 1 and these mixtures were mixed with other components to obtain a resin composition. Using the resin composition, tablets (columnar form having a diameter of 14 mm and a height of 17 mm) were molded by the production apparatus shown in FIG. 4 [the stirrer in the apparatus also had the construction shown in FIG. 2 (a) and (b)] while evacuating from the degassing outlet 100.

When the content of the volatile matters in the tablet thus obtained was measured in the same manner as in Example 1, the content was 0.03% and the content of each volatile matter was as follows.

The water content was 0.01%, the content of methanol was 0.01%, and the content of benzene was 0.01%.

The compressibility of the tablet was at least 98% and when the deviation of the distribution of the compressibility in the lengthwise direction of the tablet (split number 4) was measured, the deviation was ±1% or less.

The content of the gelled particles of 60 mesh on in the tablet was 0 and the content of the gelled particles of 100 mesh on was 2 ppm or less. The content of the metallic impurities in the tablet was less than 10 ppm, and the amount of the fine powder attached to the tablet was less than 0.02%. The Shore hardness of the tablet (measured at 23° C.) was 70.

When the tablet thus produced was transfer molded in the same manner as in Example 1 and the average void number (void sizes of 0.1 mm or less) per one cavity was measured in the same manner as described above, the average void number was 0.07 only.

COMPARATIVE EXAMPLE 1

The same procedure as in Example 1 was followed under the same conditions in the components of the resin composition, the kneading extruder, the tablet molding mold, the injection amount of the resin composition, the kneading temperature, the molding pressure, the temperature of circulating cooling water, etc., as in Example 1 except that all the materials were dry blended simultaneously by a Henschel mixer for 30 minutes.

The average void number (void sizes of at least 0.1 mm in diameter) per one cavity was large as 8. Further, the content of the gelled particles of 60 meth on reached 200 ppm and clogging of the gate occurred during transfer molding.

COMPARATIVE EXAMPLE 2

The same procedure as in Comparative Example 1 was followed except that the kneading extruder having the stirrer 22 was used.

The content of the gelled particles of 60 mesh on could be decreased to 0 but the average void number (void sizes of at least 0.1 mm in diameter) was large as 8.

COMPARATIVE EXAMPLE 3

The same procedure as in Example 1 was followed except that a kneading extruder having no stirrer 22 was used. That is, other conditions of the components of the resin composition, mixing of the mixture of the curing agent and the curing accelerator and the mixture of the filler and the surface treating agent after subjecting them to the pretreatment with other components, the kneading extruder, the tablet molding mold, the injection amount of the resin composition, the kneading temperature, the molding pressure, the temperature of circulating cooling water, etc., were the same as in Example 1.

The average void number (void sizes of at least 0.1 mm in diameter) per one cavity was 0.1, but the content of the gelled particles of 60 mesh on reached 200 ppm and clogging of the gate occurred during transfer molding.

Since in the resin tablet of the present invention, the content of the volatile matters is 0.05% by weight or less, the content of the gelled particle of 60 mesh on contained in the tablet is 0, and the content of the gelled particles of 100 mesh on is 10 ppm or less, sealing of a semiconductor chip by transfer molding can be smoothly conducted using the resin tablet without accompanied by clogging of gate even in the case of a very shallow gate. Further, the cured resin having packed therein a semiconductor chip obtained can be substantially voidless.

While the invention has been described in detail and with reference to specific embodiments thereof, it will be apparent to one skilled in the art that various changes and modifications can be made therein without departing from the spirit and scope thereof.

What is claimed is:

1. A process for producing a semiconductor device comprising the steps of:

(a) solidifying a molten thermosetting resin composition by cooling, to form directly therefrom a resin tablet having a content of water together with volatile organic compounds of 0.05% by weight or less, and a gelled particles content of zero for particles of 60 mesh on and 10 ppm or less for particles of 100 mesh on; and (b) providing a semiconductor device by sealing a semiconductor element with the formed resin tablet.

2. A process according to claim 1, wherein the resin tablet contains volatile organic compounds in an amount of 0.03% by weight or less.

3. A process according to claim 1, wherein the resin tablet has a compressibility of at least 98%.

4. A process according to claim 1, the tablet having a metallic impurities content of less than 50 ppm.

5. A process according to claim 1, wherein the resin tablet has a Shore hardness (measured at 23° C.) of at least 65.

6. A process according to claim 1, wherein the thermosetting resin composition comprises an epoxy resin composition as a main component.

7. A process according to claim 6, further comprising curing the epoxy resin with a novolak resin.

8. A process according to claim 7, wherein the sealing is conducted with transfer molding.

9. The process of claim 1, wherein the resin tablet has a compressibility distribution with a deviation of ±1% or less.

10. The process of claim 6, wherein the thermosetting resin composition further comprises a curing agent, a curing accelerator, a filler, and/or a surface treating agent.

11. The process of claim 1, further comprising measuring the content of water together with volatile organic compounds.

12. The process of claim 11, wherein the measuring uses gas chromatography.

13. The process of claim 1, wherein the water content in the resin tablet is 0.02% by weight or less.

14. The process of claim 2, wherein the water content in the resin tablet is 0.02% by weight or less.

15. The process of claim 1, further comprising measuring the content of gelled particles in the resin tablet.

16. A process for producing a semiconductor device comprising the steps of:

(i) preheating one or more components to provide a thermosetting resin composition;

(ii) heating the thermosetting resin composition to a molten state followed by solidifying the molten thermosetting resin composition by cooling, to form directly therefrom a resin tablet having a content of water together with volatile organic compounds of 0.05% by weight or less, and a gelled particles content of zero for particles of 60 mesh on and 10 ppm or less for particles of 100 mesh on; and (iii) providing a semiconductor device by sealing a semiconductor element with the formed resin tablet.

17. The process of claim 16, wherein the pre-heating is to about 150° C. for about 30 minutes.

18. The process of claim 16, wherein the pre-heating is under reduced pressure.

19. The process of claim 16, wherein one or more of the components are pre-heated separately.

20. The process of claim 16, wherein one or more of the components are pre-heated as a mixture.

21. The process of claim 16, wherein volatile compounds are removed.

22. A method of reducing gate-clogging in a plasticizing pressuring method for semiconductor device production wherein a resin tablet seals a semiconductor element, comprising the step of providing a resin tablet formed by solidifying a molten thermosetting resin composition by cooling, to form directly therefrom a resin tablet having a content of water together with volatile organic compounds of 0.05% by weight or less, and a gelled particles content of zero for particles of 60 mesh on and 10 ppm or less for particles of 100 mesh on.

* * * * *